US012777869B2

(12) United States Patent
Ono

(10) Patent No.: US 12,777,869 B2
(45) Date of Patent: Oct. 27, 2026

(54) POSITION DETERMINING METHOD AND MANUFACTURING METHOD OF SEMICONDUCTOR DEVICE

(71) Applicant: Kioxia Corporation, Tokyo (JP)

(72) Inventor: Takanobu Ono, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 350 days.

(21) Appl. No.: 18/363,841

(22) Filed: Aug. 2, 2023

(65) Prior Publication Data

US 2024/0071826 A1 Feb. 29, 2024

(30) Foreign Application Priority Data

Aug. 31, 2022 (JP) ................................ 2022-138673

(51) Int. Cl.
*H10P 54/00* (2026.01)
*H10P 52/00* (2026.01)
*H10P 74/20* (2026.01)

(52) U.S. Cl.
CPC .............. *H10P 54/00* (2026.01); *H10P 52/00* (2026.01); *H10P 74/203* (2026.01)

(58) Field of Classification Search
None
See application file for complete search history.

(56) References Cited

U.S. PATENT DOCUMENTS 5,194,743 A * 3/1993 Aoyama ............. G03F 7/70716 250/548
5,905,850 A * 5/1999 Kaveh ..................... H10P 72/53 414/217
6,192,289 B1 * 2/2001 Geffen .................. G06T 7/0004 700/121
6,225,012 B1 * 5/2001 Nishi .................... G03F 9/7011 430/30
7,519,448 B2 4/2009 Ikeda et al.
8,523,636 B2 9/2013 Uchiyama
9,266,192 B2 * 2/2016 Frankel ................ B23K 26/032
9,360,773 B2 * 6/2016 Fukushi .............. G03F 7/70775
(Continued)

FOREIGN PATENT DOCUMENTS

JP S49102280 A 9/1974
JP 2001267193 A 9/2001
(Continued)

OTHER PUBLICATIONS

Machine translation of JP2002-198415 (Year: 2002).*

*Primary Examiner* — Erik T. K. Peterson
(74) *Attorney, Agent, or Firm* — Holtz, Holtz & Volek PC

(57) ABSTRACT

A position determining method according to the present embodiment is a position determining method of a wafer which has a plurality of singulated chips and which is pasted on a tape. In addition, the present position determining method includes irradiating, with light, the wafer which has a first cut mark provided between the chips and a second cut mark with a width that differs from a width of the first cut mark. Furthermore, the present position determining method includes receiving irradiated light at a position opposing an irradiation position of light across the wafer. In addition, the present position determining method includes determining a position of the wafer based on a width of received light having passed through the wafer.

6 Claims, 18 Drawing Sheets

(56) References Cited

U.S. PATENT DOCUMENTS 9,770,842 B2 9/2017 Katoh et al.
9,865,468 B2 1/2018 Ono et al.
2003/0023343 A1* 1/2003 Tomita .................... H10P 72/53 414/940
2003/0092244 A1* 5/2003 Oi ........................... H10P 72/53 438/455
2003/0224540 A1* 12/2003 Watanabe ............... H10P 54/00 438/7
2007/0275541 A1* 11/2007 Harris ..................... H10P 54/00 438/460
2008/0102606 A1* 5/2008 Sekiya .................... H10P 54/00 257/E21.536
2012/0122252 A1* 5/2012 Fujimori ............... H10P 74/203 356/51
2016/0125583 A1* 5/2016 Amanullah ............. G06T 7/001 348/87
2016/0172203 A1* 6/2016 Ono ........................ H10P 52/00 438/462
2016/0211218 A1* 7/2016 Hara ..................... H10W 46/00
2017/0125271 A1* 5/2017 Minato ............... H10P 72/0606
2018/0311762 A1* 11/2018 Van Der Stam ..... B23K 26/032
2019/0067059 A1* 2/2019 Ha ...................... H10P 72/0616
2019/0101839 A1* 4/2019 Janda .................. G03F 7/70775
2020/0335370 A1* 10/2020 Ohkubo ............... B28D 5/0094
2023/0294230 A1* 9/2023 Takemura ............ B23Q 17/003

FOREIGN PATENT DOCUMENTS

JP 2002198415 A * 7/2002
JP 2007157897 A 6/2007
JP 2009131942 A 6/2009
JP 2014033122 A 2/2014
JP 2016082023 A 5/2016
JP 2016115803 A 6/2016

* cited by examiner

POSITION DETERMINING METHOD AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2022-138673, filed on Aug. 31, 2022, the entire contents of which are incorporated herein by reference.

FIELD

The embodiments of the present invention relate to a position determining method and a manufacturing method of a semiconductor device.

BACKGROUND

Chipping and the like may occur during grinding of a back surface of a semiconductor wafer. Any chipping of a semiconductor wafer may affect position determination of the semiconductor wafer.

DETAILED DESCRIPTION

Figure 1A:
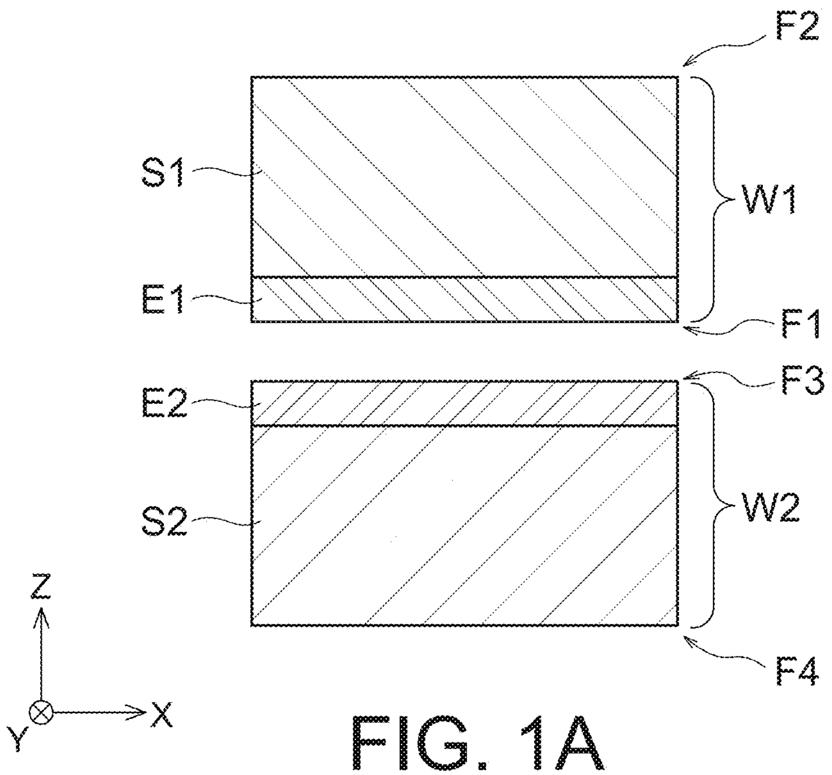
FIG. 1A is a cross sectional view showing an example of a manufacturing method of a semiconductor device according to a first embodiment.

Embodiments will now be explained with reference to the accompanying drawings. The present invention is not limited to the embodiments. It should be noted that the drawings are schematic or conceptual, and the relationship between the thickness and the width in each element and the ratio among the dimensions of elements do not necessarily match the actual ones. Even if two or more drawings show the same portion, the dimensions and the ratio of the portion may differ in each drawing. In the present specification and the drawings, elements identical to those described in the foregoing drawings are denoted by like reference characters and detailed explanations thereof are omitted as appropriate.

A position determining method according to the present embodiment is a position determining method of a wafer which has a plurality of singulated chips and which is pasted on a tape. In addition, the present position determining method includes irradiating, with light, the wafer which has a first cut mark provided between the chips and a second cut mark with a width that differs from a width of the first cut mark. Furthermore, the present position determining method includes receiving irradiated light at a position opposing an irradiation position of light across the wafer. In addition, the present position determining method includes determining a position of the wafer based on a width of received light having passed through the wafer.

First Embodiment

A manufacturing method of a semiconductor device according to the first embodiment includes singulating semiconductor wafers bonded together into a plurality of semiconductor chips CH, picking up the semiconductor chips CH, and mounting the semiconductor chips CH on a substrate or the like.

First, a method of bonding together semiconductor wafers will be described.

FIGS. 1A to 1E are cross sectional views showing an example of a manufacturing method of a semiconductor device according to the first embodiment.

First, as shown in FIG. 1A, two semiconductor wafers W1 and W2 are prepared.

Note that FIG. 1A shows an X direction and a Y direction which are parallel to surfaces of the semiconductor wafers W1 and W2 and which are perpendicular to each other and a Z direction which is perpendicular to the surfaces of the semiconductor wafers W1 and W2. In the present specification, a +Z direction is considered an upward direction and a −Z direction is considered a downward direction. The −Z direction may or may not coincide with a direction of gravitational force.

The semiconductor wafer W1 has a face F1 and a face F2. In addition, the semiconductor wafer W1 has a substrate S1 and a semiconductor element E1. For example, the substrate S1 is a silicon substrate. The semiconductor element E1 is provided on the face F1. The face F2 is a face on an opposite side to the face F1.

The semiconductor wafer W2 has a face F3 and a face F4. In addition, the semiconductor wafer W2 has a substrate S2 and a semiconductor element E2. For example, the substrate S2 is a silicon substrate. The semiconductor element E2 is provided on the face F3. The face F4 is a face on an opposite side to the face F3.

Figure 1B:
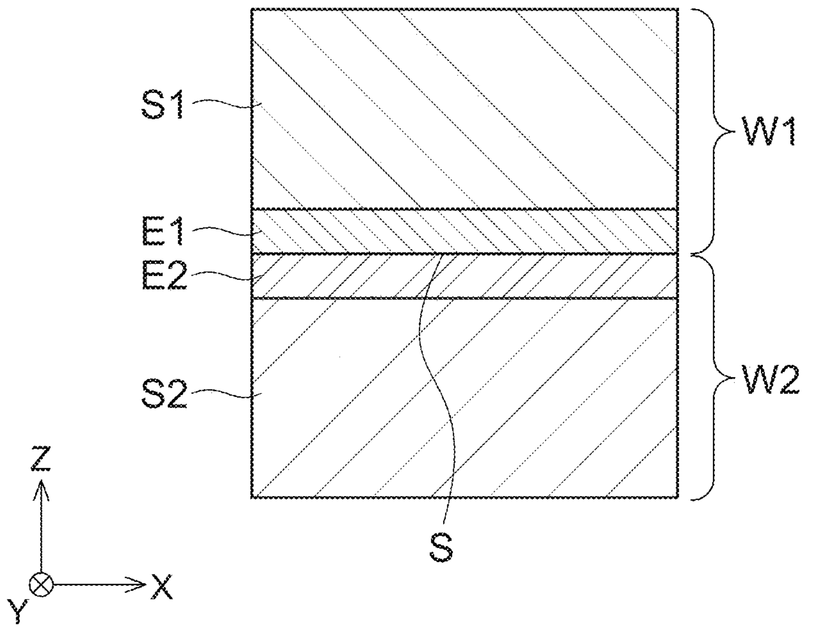
FIG. 1B is a cross sectional view showing an example of a manufacturing method of a semiconductor device that is a continuation of FIG. 1A.

Next, as shown in FIG. 1B, the face F1 of the semiconductor wafer W1 and the face F3 of the semiconductor wafer W2 are bonded together. The semiconductor wafers W1 and W2 are joined at a bonded interface S.

Figure 1C:
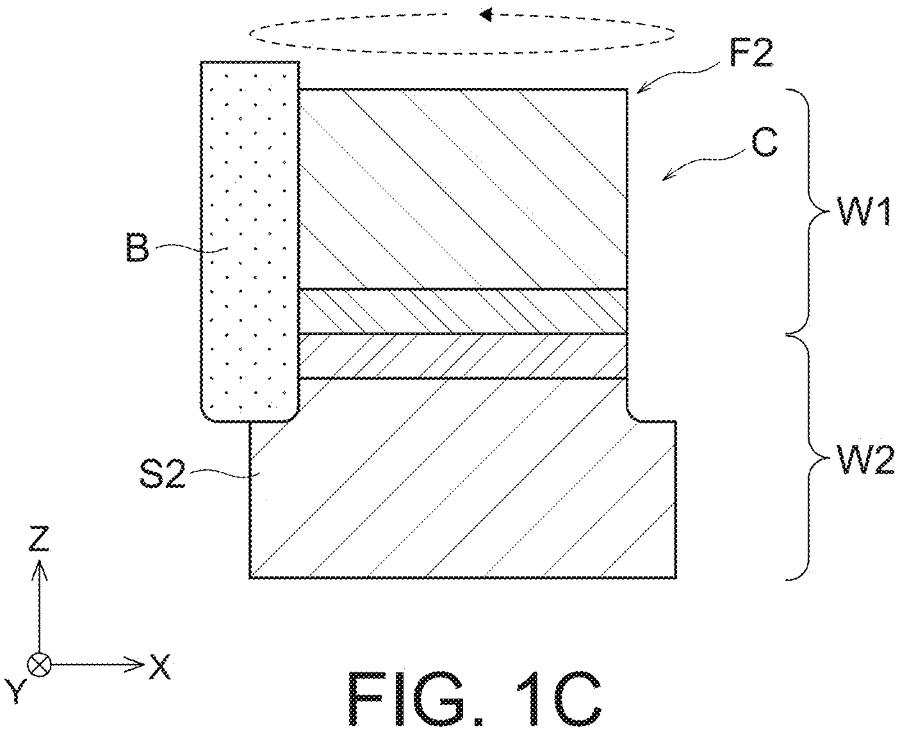
FIG. 1C is a cross sectional view showing an example of a manufacturing method of a semiconductor device that is a continuation of FIG. 1B.

Next, as shown in FIG. 1C, edge trimming is performed. Specifically, a cutout section C which reaches the semiconductor wafer W2 from a side of the face F2 is formed in an outer circumferential end section of the semiconductor wafer W1 and the semiconductor wafer W2 that are bonded together. By forming the cutout section C, chipping of an outer circumferential end section of the substrate S1 can be suppressed in a subsequent back surface grinding step of the substrate S1.

Figure 1D:
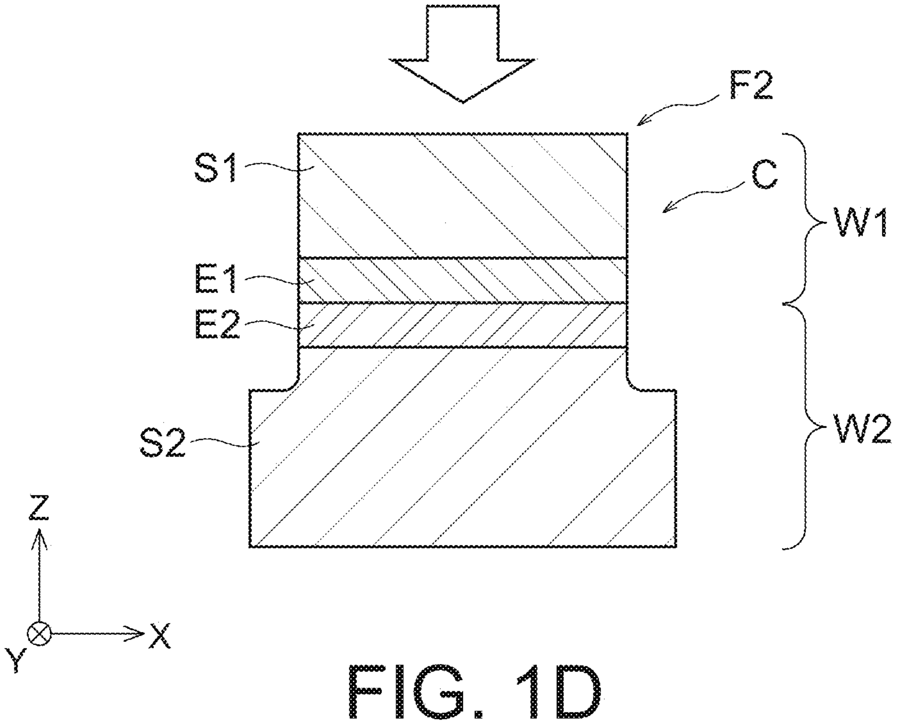
FIG. 1D is a cross sectional view showing an example of a manufacturing method of a semiconductor device that is a continuation of FIG. 1C.

Next, as shown in FIG. 1D, back surface grinding of the substrate S1 is performed. In other words, the semiconductor wafer W1 is ground from the side of the face F2.

Figure 1E:
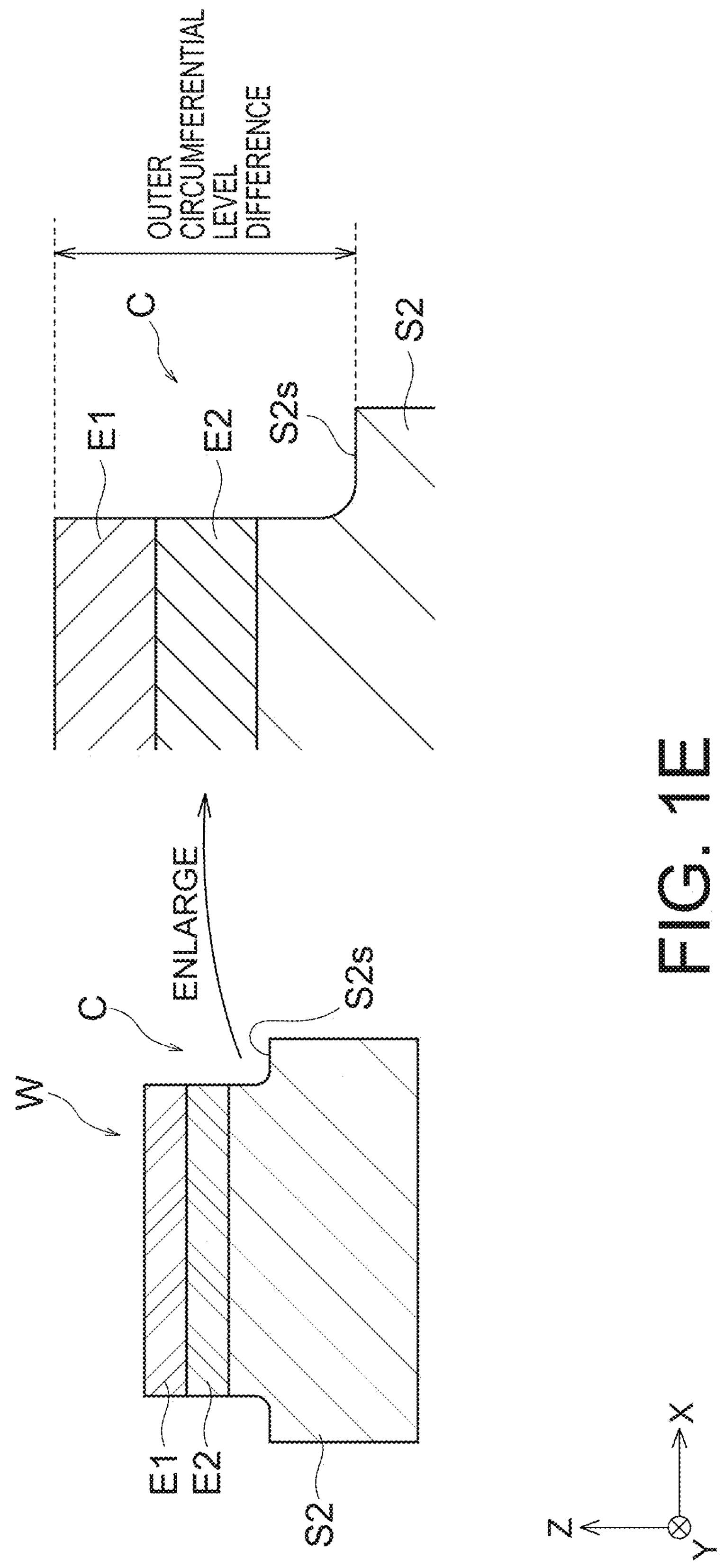
FIG. 1E is a cross sectional view showing an example of a manufacturing method of a semiconductor device that is a continuation of FIG. 1D.

The grinding is continued and, as shown in FIG. 1E, the semiconductor wafer W in which the semiconductor wafers W1 and W2 are bonded together is completed. As shown in an enlarged view of FIG. 1E, an outer circumferential level difference is present between the face F2 being an upper surface of the semiconductor wafer W and a bottom surface of the cutout section C. In other words, a level difference portion (an eaves portion) S2*s* is present in the semiconductor wafer W2.

Next, a method of singulating the bonded-together semiconductor wafer W into a plurality of semiconductor chips CH will be described.

FIGS. 2A to 2D are cross sectional views showing an example of the manufacturing method of a semiconductor device according to the first embodiment. Note that FIGS. 2A to 2D show a part of a cross section of the semiconductor wafer W.

Figure 2A:
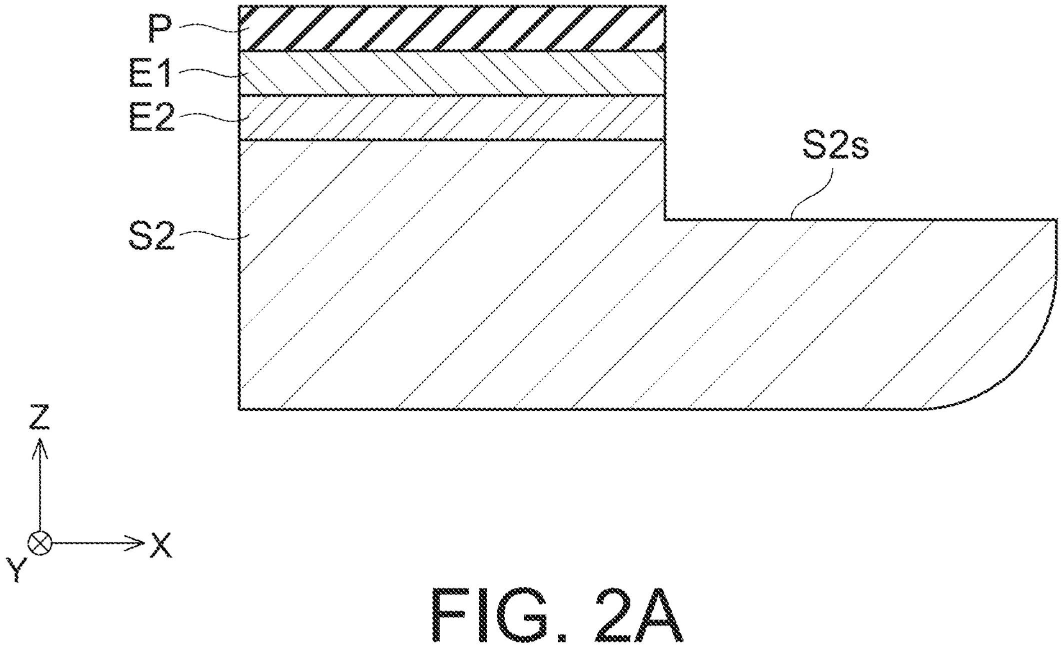
FIG. 2A is a cross sectional view showing an example of a manufacturing method of a semiconductor device according to the first embodiment.

FIG. 2A shows the bonded-together semiconductor wafer W in a similar manner to FIG. 1E. In addition, a film P is provided on the semiconductor element E1 of the semiconductor wafer W1. The film P is a surface protective film made of PI (polyimide) or the like.

Figure 2B:
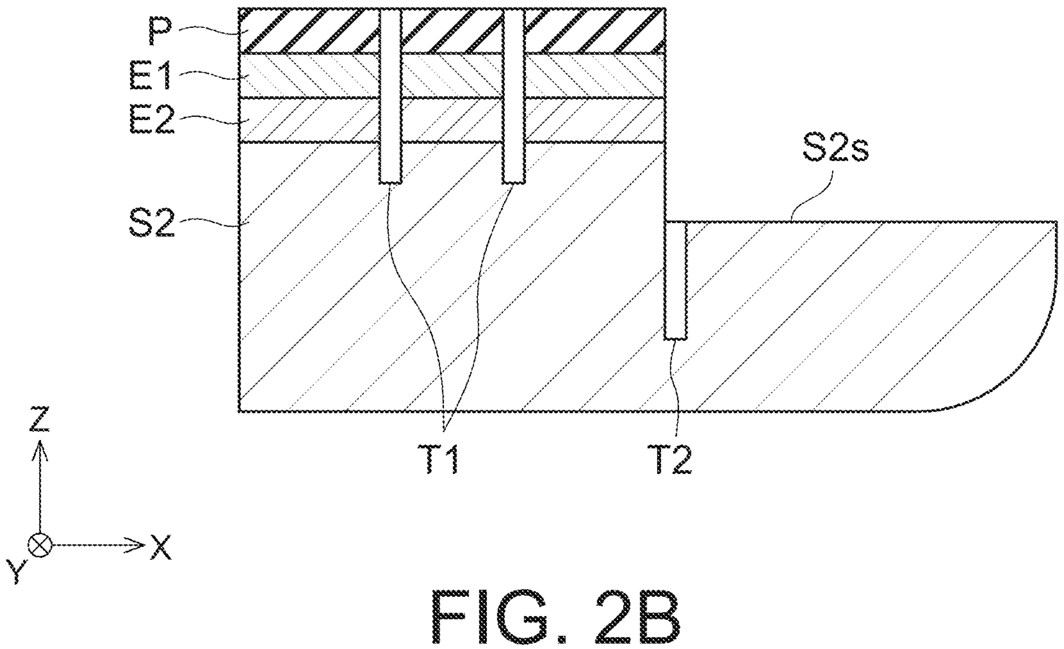
FIG. 2B is a cross sectional view showing an example of a manufacturing method of a semiconductor device that is a continuation of FIG. 2A.

Next, as shown in FIG. 2B, a cut mark T1 is formed and a cut mark T2 is formed.

The cut mark T1 is formed on a scribe line of the semiconductor wafer W1 and the semiconductor wafer W2 that are bonded together. The cut mark T1 is formed in order to separate (singulate) the semiconductor chips CH.

The cut mark T2 is a cut mark that differs from the cut mark T1. The cut mark T2 is formed in order to cut off the level difference portion S2*s*. As will be described later, the cut mark T2 is formed in order to improve grinding quality of the semiconductor wafer W and improve recognizability of a notch N when determining a position of the semiconductor wafer W.

The cut mark T2 is deeper than the cut mark T1 with respect to the face F2. Accordingly, in the subsequent back surface grinding step of the substrate S2 to be described later with reference to FIG. 2C and FIG. 2D, a grinding position reaches the cut mark T2 before reaching the cut mark T1. Accordingly, the semiconductor chips CH are separated after the level difference portion S2*s* is cut off and drops.

Figure 2C:
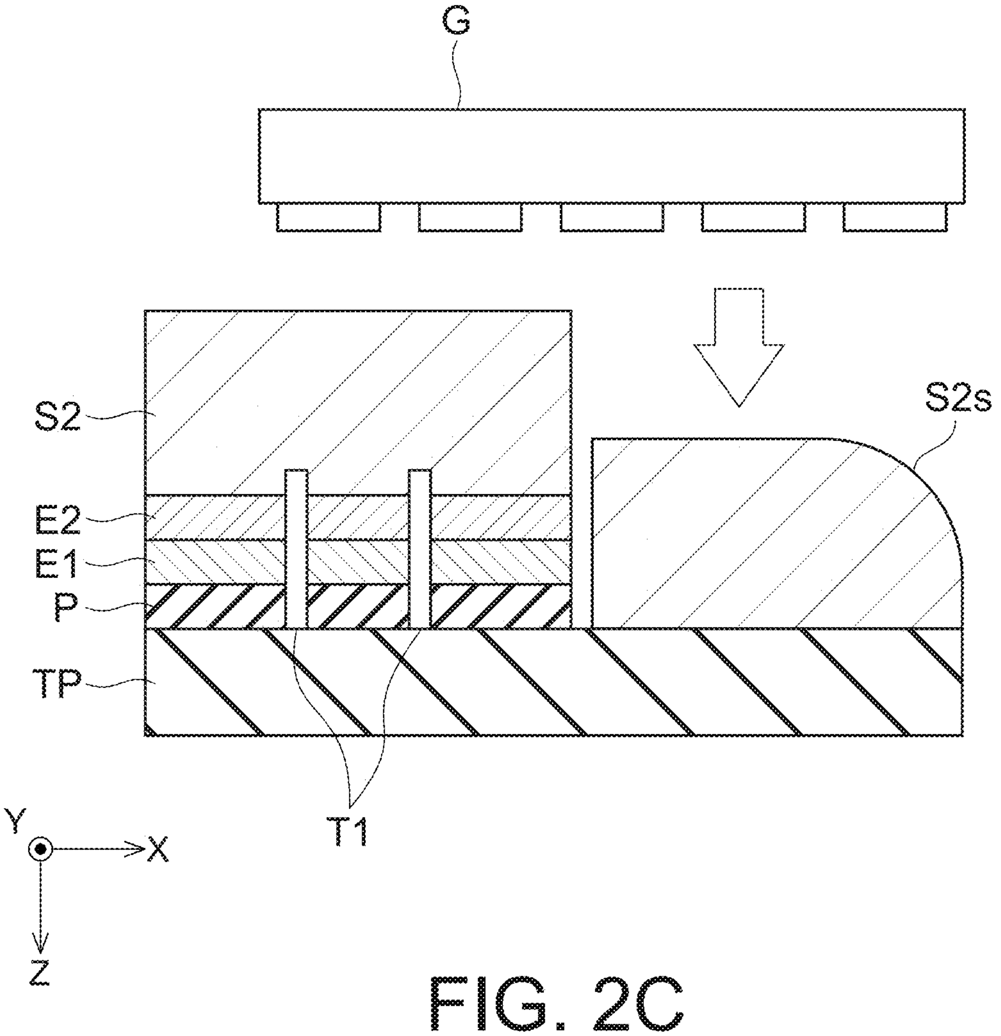
FIG. 2C is a cross sectional view showing an example of a manufacturing method of a semiconductor device that is a continuation of FIG. 2B.

Next, as shown in FIG. 2C, back surface grinding of the substrate S2 is performed. In other words, the semiconductor wafer W2 is ground from the side of the face F4. Note that, in FIG. 2C, top and bottom have been reversed from FIG. 2B. In addition, a tape TP is shown in FIG. 2C. The tape TP is a protective tape such as a back grind tape.

As shown in FIG. 2C, for example, when a grinding position reaches the cut mark T2, the level difference portion S2*s* drops and separates from the bonded-together semiconductor wafer W. This is because a portion not cut off by the cut mark T2 is cut off by thinning and a grinding load of the substrate S2. The level difference portion S2*s* is bonded to the tape TP.

Figure 2D:
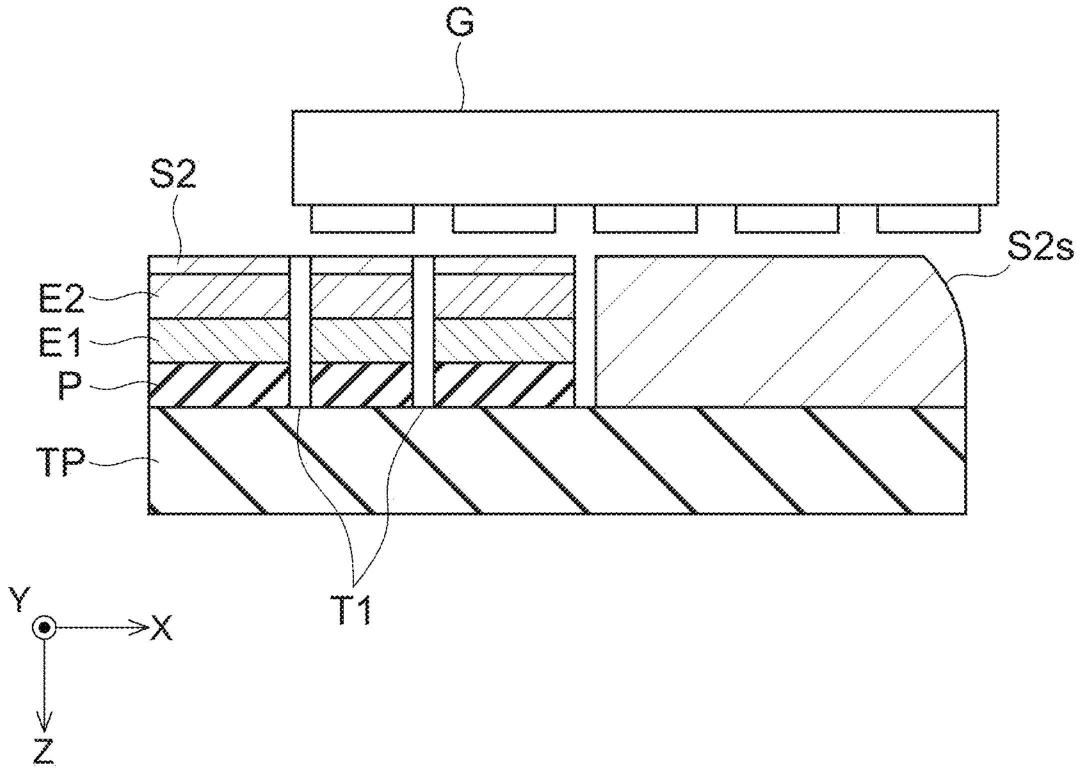
FIG. 2D is a cross sectional view showing an example of a manufacturing method of a semiconductor device that is a continuation of FIG. 2C.

The back surface grinding is further continued and, as the grinding position reaches the cut mark T1 as shown in FIG. 2D, the bonded-together semiconductor wafer W is singulated into a plurality of the semiconductor chips CH. After the singulation, the back surface grinding is finished.

Next, a placement and a shape of the cut mark T2 will be described.

Figure 3A:
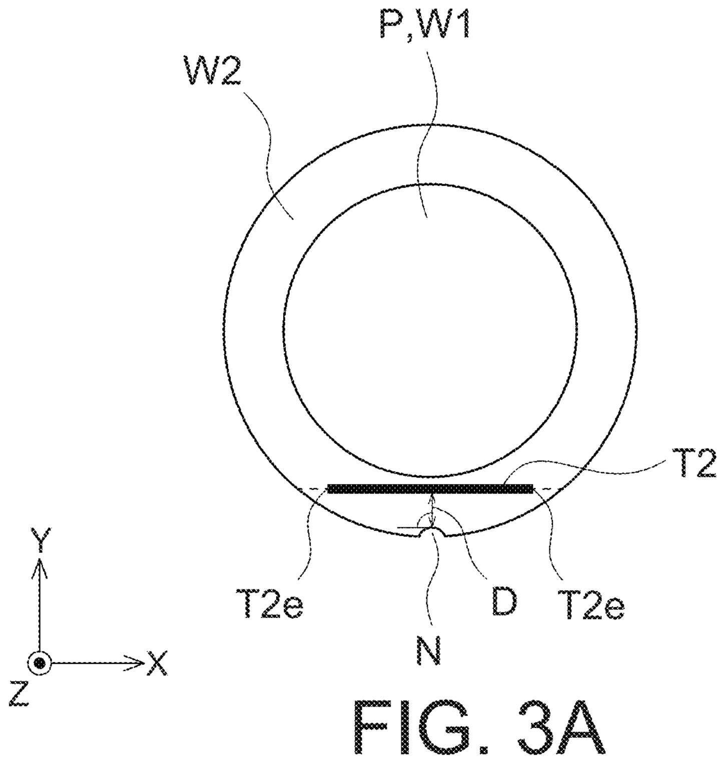
FIG. 3A is a top view showing an example of a placement and a shape of a cut mark according to the first embodiment.
Figure 3B:
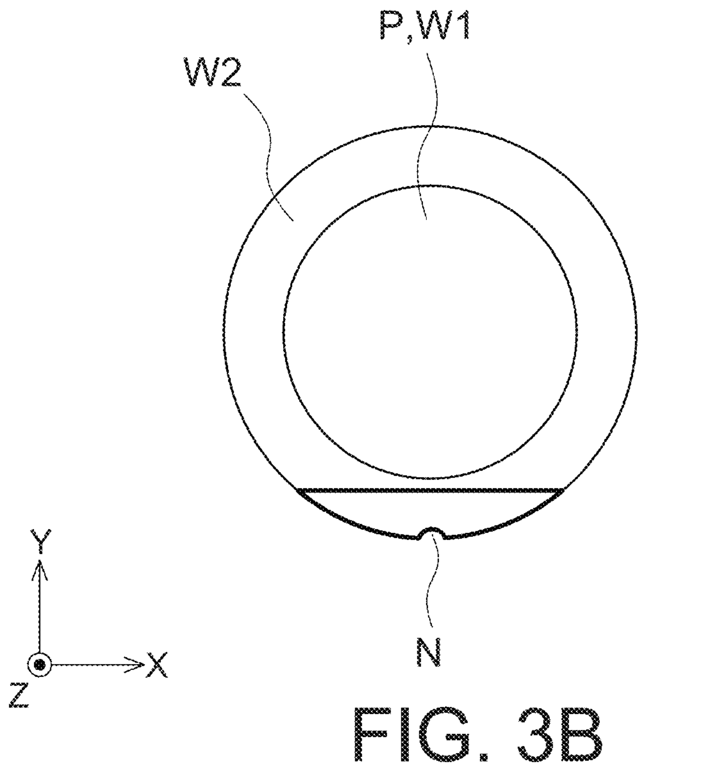
FIG. 3B is a top view showing an example of a shape of a level difference portion that is separated by a cut mark according to the first embodiment.

FIG. 3A is a top view showing an example of a placement and a shape of the cut mark T2 according to the first embodiment. FIG. 3B is a top view showing an example of a shape of the level difference portion S2*s* that is separated by the cut mark T2 according to the first embodiment. FIG. 3A is a diagram in which the bonded-together semiconductor wafer W is viewed from the Z direction in the step shown in FIG. 2B. Note that the cut mark T1 has been omitted in FIG. 3A. In addition, a difference in area between the semiconductor wafer W1 and the semiconductor wafer W2 (a width of the level difference portion S2*s*) and a size of the notch N are not limited to the examples shown in FIG. 3A and FIG. 3B.

The cut mark T2 is provided in an outer circumferential portion of the semiconductor wafer W or, in other words, the level difference portion S2*s*. More specifically, the cut mark T2 is placed so that the level difference portion S2*s* separated by the cut mark T2 includes the notch N.

The cut mark T2 is formed at a position in accordance with a position of the notch N of the semiconductor wafer W2. Accordingly, the notch N can be made more detectable from the position of the cut mark T2 in position determination of the semiconductor wafer W to be described later. In the example shown in FIG. 3A, the cut mark T2 is formed at a position separated from the notch N by 10 mm as a distance D at an angle of 90 degrees (the Y direction).

The cut mark T2 has an end section T2*e* on the semiconductor wafer W1 and the semiconductor wafer W2 that are bonded together as viewed from a direction approximately perpendicular to the face F2 (Z direction). Therefore, the cut mark T2 does not provide a through-cut in the plane of the semiconductor wafer W. For example, the cut mark T2 has two end sections T2*e*.

In addition, the cut mark T2 does not reach the outer circumferential end section of the semiconductor wafer W2.

More specifically, the two end sections T2*e* of the cut mark T2 do not reach the outer circumferential end section of the semiconductor wafer W2. The cut mark T2 is not formed on a dotted line extending from the end sections T2*e*. Accordingly, the level difference portion S2*s* is not separated from the semiconductor wafer W in the step shown in FIG. 2B but separated from the semiconductor wafer W in the back surface grinding step shown in FIG. 2C. As shown in FIG. 3B, an outline of the level difference portion S2*s* which drops has a half-moon shape indicated by a bold line portion. Due to stress and the like which is applied in the grinding step, the level difference portion S2*s* is separated from the semiconductor wafer W2 with the dotted portion shown in FIG. 3A as a boundary. In addition, the level difference portion S2*s* which drops and adheres to the tape TP includes the notch N.

The cut mark T2 is made by, for example, an infrared laser, a blade, or an ultraviolet laser. The cut mark T2 is formed from a front surface or a back surface of the semiconductor wafer W depending on the formation method.

In addition, the cut mark T2 has, for example, a straight shape.

Next, a difference in formation methods between the cut marks T1 and T2 will be described.

Figure 4:
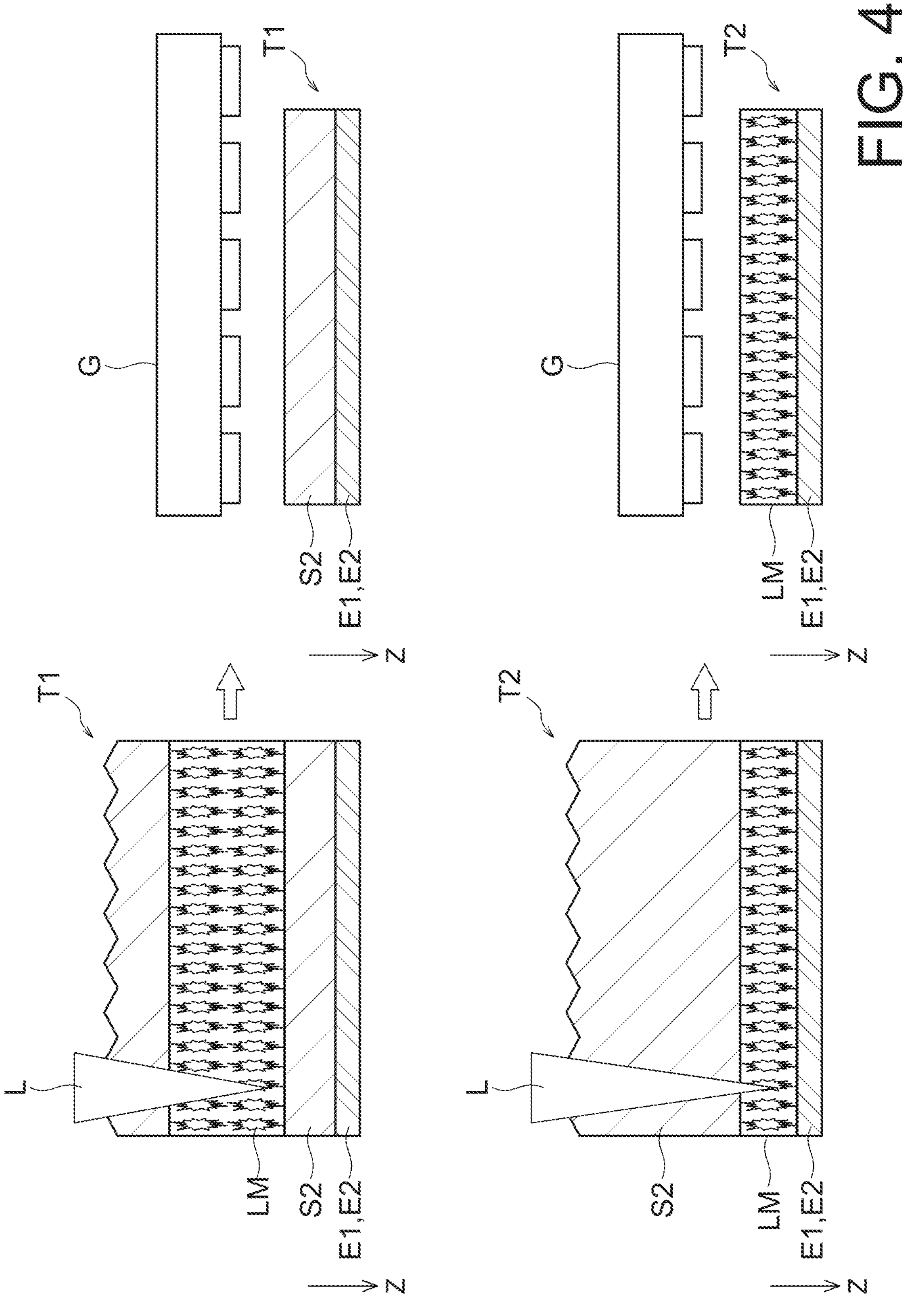
FIG. 4 is a cross sectional view showing an example of a formation method of a cut mark according to the first embodiment.

FIG. 4 is a cross sectional view showing an example of formation methods of the cut marks T1 and T2 according to the first embodiment. FIG. 4 shows a case where the cut marks T1 and T2 are formed by stealth dicing as an example. In addition, FIG. 4 is a cross sectional view from a direction approximately perpendicular to a direction in which the cut marks T1 and T2 extend.

A top left part in FIG. 4 shows a modifier (modifying layer) LM in the cut mark T1 prior to back surface grinding. A top right part in FIG. 4 shows the modifier LM in the cut mark T1 after back surface grinding. A bottom left part in FIG. 4 shows the modifier LM in the cut mark T2 prior to back surface grinding. A bottom right part in FIG. 4 shows the modifier LM in the cut mark T2 after grinding. Note that a crack that spreads from the modifier LM is omitted in FIG. 4.

In stealth dicing, the modifier LM is formed in the substrate S2 by a laser light L. Adjusting a focus position of the laser light L enables a formation position of the modifier LM to be adjusted. The modifier LM included in the cut mark T2 is formed at a deeper position (a position on the side of the semiconductor wafer W1) than the modifier LM included in the cut mark T1. The modifier LM of the cut mark T1 is removed by back surface grinding. On the other hand, the modifier LM of the cut mark T2 remains after back surface grinding. Accordingly, after back surface grinding, the cut mark T2 with a larger width than the width of the cut mark T1 can be formed.

The cut marks T1 and T2 may be formed by blade dicing instead of stealth dicing. In this case, blades with different widths are used between a blade for forming the cut mark T1 and a blade for forming the cut mark T2.

Next, a method of determining a position of the bonded-together semiconductor wafer W will be described.

Figure 5:
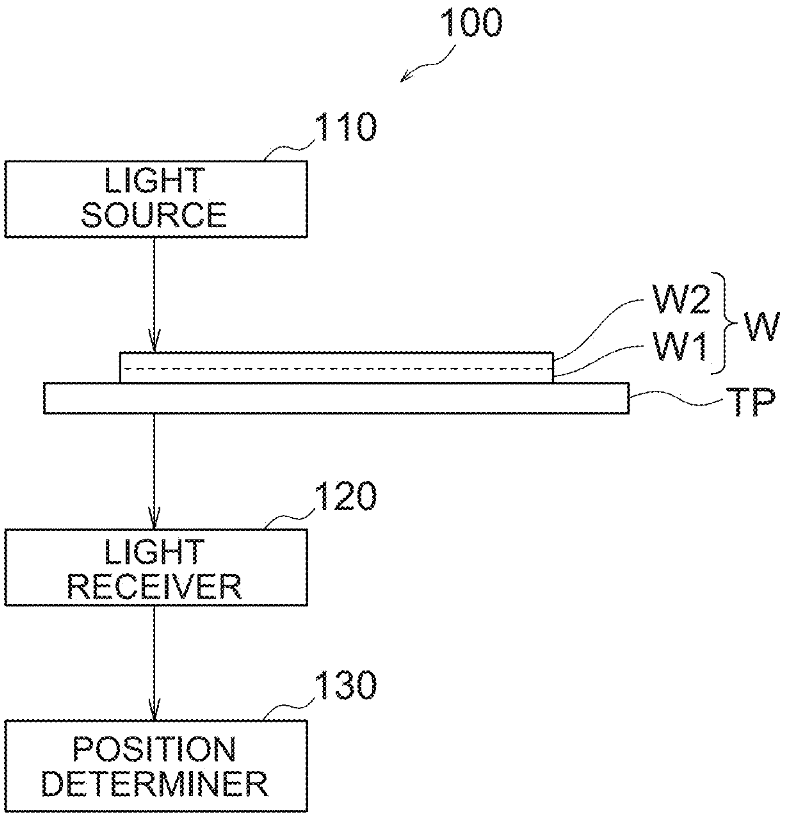
FIG. 5 is a diagram showing an example of a configuration of a position determination device according to the first embodiment.

FIG. 5 is a diagram showing an example of a configuration of a position determination device 100 according to the first embodiment. The semiconductor wafer W shown in FIG. 5 has a plurality of singulated semiconductor chips CH. The semiconductor wafer W is pasted to the tape TP.

The position determination device 100 includes a light source 110, a light receiver 120, and a position determiner 130.

The light source 110 irradiates the semiconductor wafer W with light. More specifically, the light source 110 irradiates the outer circumferential end section of the semiconductor wafer W where the notch N is provided with light.

The light receiver 120 receives light of the light source 110. For example, the light receiver 120 is an imager of a camera or the like.

The light source 110 and the light receiver 120 are arranged so as to sandwich the semiconductor wafer W along a direction approximately perpendicular to the semiconductor wafer W.

The position determiner 130 determines a position (handling position) of the semiconductor wafer W based on a result of light reception by the light receiver 120. The position of the semiconductor wafer W includes, for example, a rotational angle or the like of the semiconductor wafer W. For example, the position determiner 130 detects the notch N using image recognition from an image captured by the light receiver. For example, the position determiner 130 determines the position of the semiconductor wafer W based on the notch N.

Figure 6A:
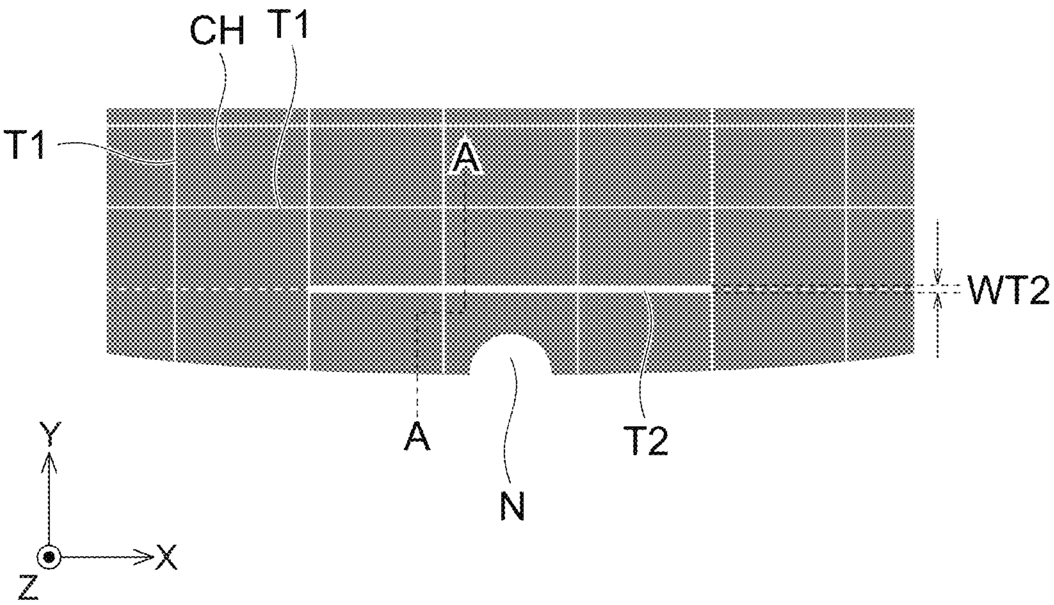
FIG. 6A is a diagram showing an example of a placement of cut marks and a notch according to the first embodiment.
Figure 6B:
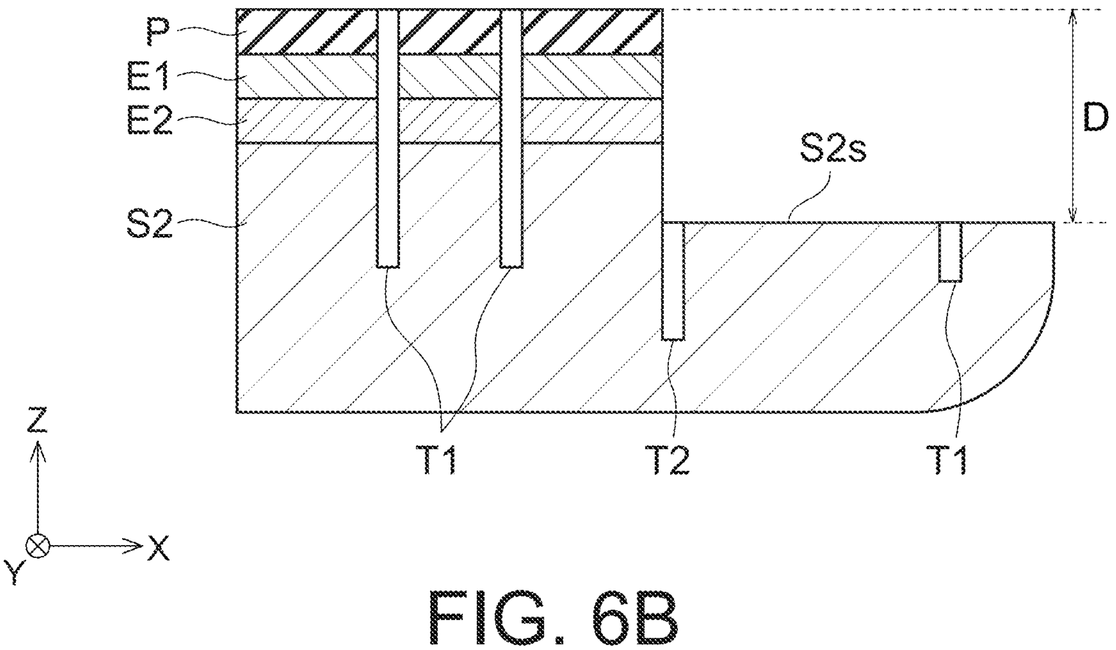
FIG. 6B is a cross sectional view of a semiconductor wafer shown in FIG. 6A.
Figure 6C:
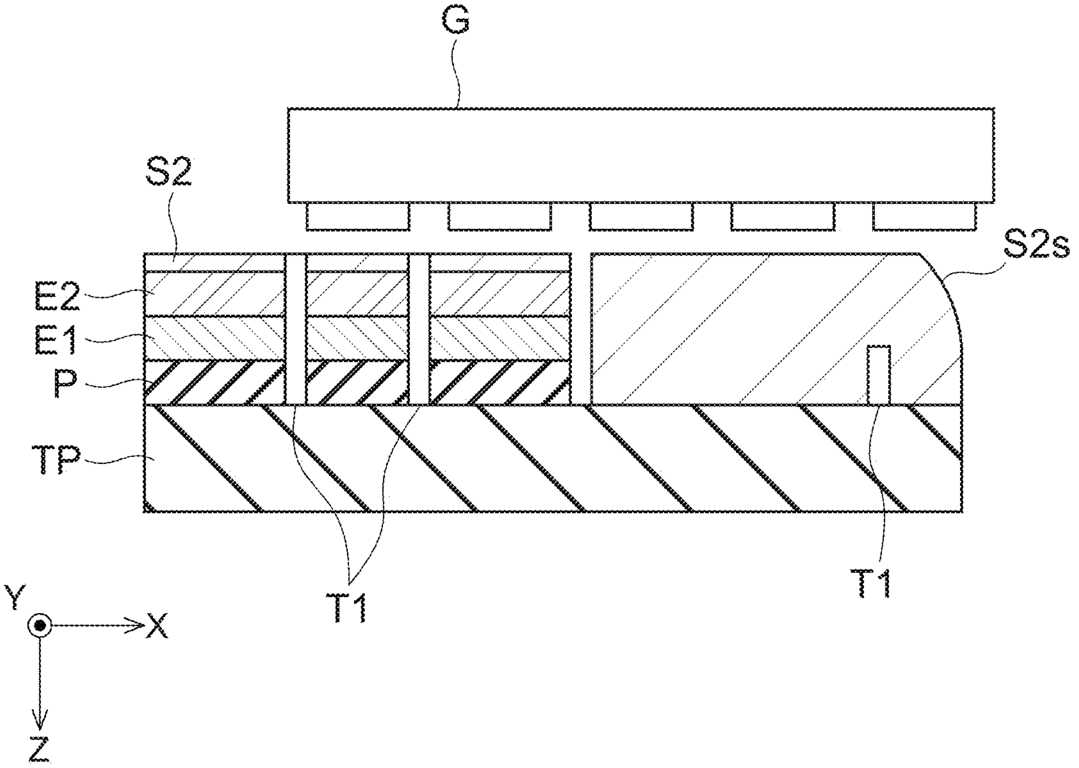
FIG. 6C is a cross sectional view of the semiconductor wafer shown in FIG. 6A.

FIG. 6A is a diagram showing an example of a placement of the cut marks T1 and T2 and the notch N according to the first embodiment. FIG. 6A shows a periphery of the cut mark T2 and the notch N. For example, FIG. 6A represents a result of light reception by the light receiver 120. FIG. 6B and FIG. 6C are cross sectional views of the semiconductor wafer W shown in FIG. 6A. FIG. 6B and FIG. 6C are cross sectional views taken along a line A-A that is a dashed-dotted line shown in FIG. 6A. Note that FIG. 6B and FIG. 6C respectively correspond to steps shown in FIG. 2B and FIG. 2D.

The semiconductor wafer W has the cut mark (groove) T1 and the cut mark (groove) T2. Note that at a time point of determination of the position shown in FIG. 6A, the cut marks T1 and T2 penetrate the semiconductor wafer W as shown in FIG. 2D. The cut mark T1 is formed between the semiconductor chips CH. The cut mark T2 has a width that differs from a width of the cut mark T1. A white dotted line corresponds to the dotted line portion shown in FIG. 3A. A width of the white dotted line portion differs from the cut mark T2. FIG. 6B shows a cross sectional view along the dashed-dotted line shown in FIG. 6A. When the cut mark T1 is made by a blade, if a depth of the blade is deeper than a depth D of the eaves portion, the cut mark T1 is also formed in the eaves portion. The cut mark T1 is not formed in the eaves portion if the depth of the blade is shallower than the depth D of the eaves portion. When the cut mark T1 is made by a laser, the cut mark T1 can be prevented from being formed in the eaves portion regardless of the depth of the cut mark T1 by switching between on and off.

The light receiver 120 receives light that passes through (which is transmitted through) the semiconductor wafer W and light that passes through an outer circumference of the semiconductor wafer W. The light that passes through the semiconductor wafer W passes through the cut marks T1 and T2.

In the example shown in FIG. 6A, a width WT2 of the cut mark T2 is larger than the width of the cut mark T1 as described with reference to FIG. 4. In this case, a width of light (luminous flux) passing through the cut mark T2 is larger than a width of light passing through the cut mark T1.

In FIG. 6A, the width is a width along the X direction and a width in a direction approximately perpendicular to the direction in which the cut mark T2 extends.

The width of the cut mark T1 is, for example, approximately 10 μm. The width WT2 of the cut mark T2 is, for example, approximately 100 μm.

Due to the difference in width, the position determiner 130 is able to detect the cut mark T2 as distinguished from the cut mark T1. The position determiner 130 determines the position of the semiconductor wafer W based on the cut mark T2. FIG. 6C shows a cross sectional view along the dashed-dotted line shown in FIG. 6A after grinding from the back surface and dividing the semiconductor chips CH. When a grinding amount of the semiconductor wafer W is small and the grinding does not reach the cut mark T1 in the eaves portion, since the eaves portion is not divided by the cut mark T1, the cut mark T1 in the eaves portion and the cut mark T1 in a device portion appear different when viewed from above. For example, when observed by light not having passed through the semiconductor wafer W, the cut mark T1 in the eaves portion is not observable. Even in such a case, since the width of the cut mark T2 and the width of the cut mark T1 between semiconductor chips differ from each other, the cut marks can be distinguished. Alternatively, when the amount of grinding of the back surface is large and the grinding reaches the cut mark T1 in the eaves portion, the eaves portion is also divided by the cut mark T1. Even in such a case, since the width of the cut mark T2 and the widths of the cut mark T1 between semiconductor chips and the cut mark T1 in the eaves portion differ from each other, the cut marks can be distinguished.

Next, a position determining method will be described.

First, the light source 110 irradiates the semiconductor wafer W with light. More specifically, the light source 110 irradiates the outer circumferential portion of the semiconductor wafer W with light.

Next, the light receiver 120 receives the light from the light source 110. In other words, the light receiver 120 receives (detects) irradiated light at a position opposing an irradiation position of light across the semiconductor wafer W.

Next, the position determiner 130 determines a position of the semiconductor wafer W based on a width of light received after passing through the semiconductor wafer W. More specifically, the position determiner 130 detects the cut mark T2 based on the width of received light. Next, the position determiner 130 detects the notch N based on the cut mark T2. For example, the position determiner 130 detects the notch N by contour recognition. Next, the position determiner 130 determines the position of the semiconductor wafer W based on the notch N.

The position determiner 130 may detect the notch N by providing feedback of information on a position where the cut mark T2 is to be formed. Accordingly, detection accuracy of the notch N can be improved.

As described above, according to the first embodiment, the light source 110 irradiates the semiconductor wafer W having the cut mark T1 and the cut mark T2 with light. Next, the light receiver 120 placed so as to oppose the light source 110 across the semiconductor wafer W receives the light emitted from the light source 110. Next, the position determiner 130 determines a position of the semiconductor wafer W based on a width of light having passed through the semiconductor wafer W and received by the light receiver 120. Accordingly, the cut mark T2 can be used to determine the position of the semiconductor wafer W and the position of the semiconductor wafer W can be determined more appropriately.

In the example shown in FIG. 2B, the cut mark T2 has a predetermined depth which does not reach the face F4 from the face F2. However, the cut mark T2 is not limited thereto and the depth of the cut mark T2 may reach the face F4 from the face F2. In this case, the level difference portion S2*s* may be separated at a time point where a grindstone (grinder G) comes into contact with the semiconductor wafer W during back surface grinding.

First Comparative Example

Figure 7:
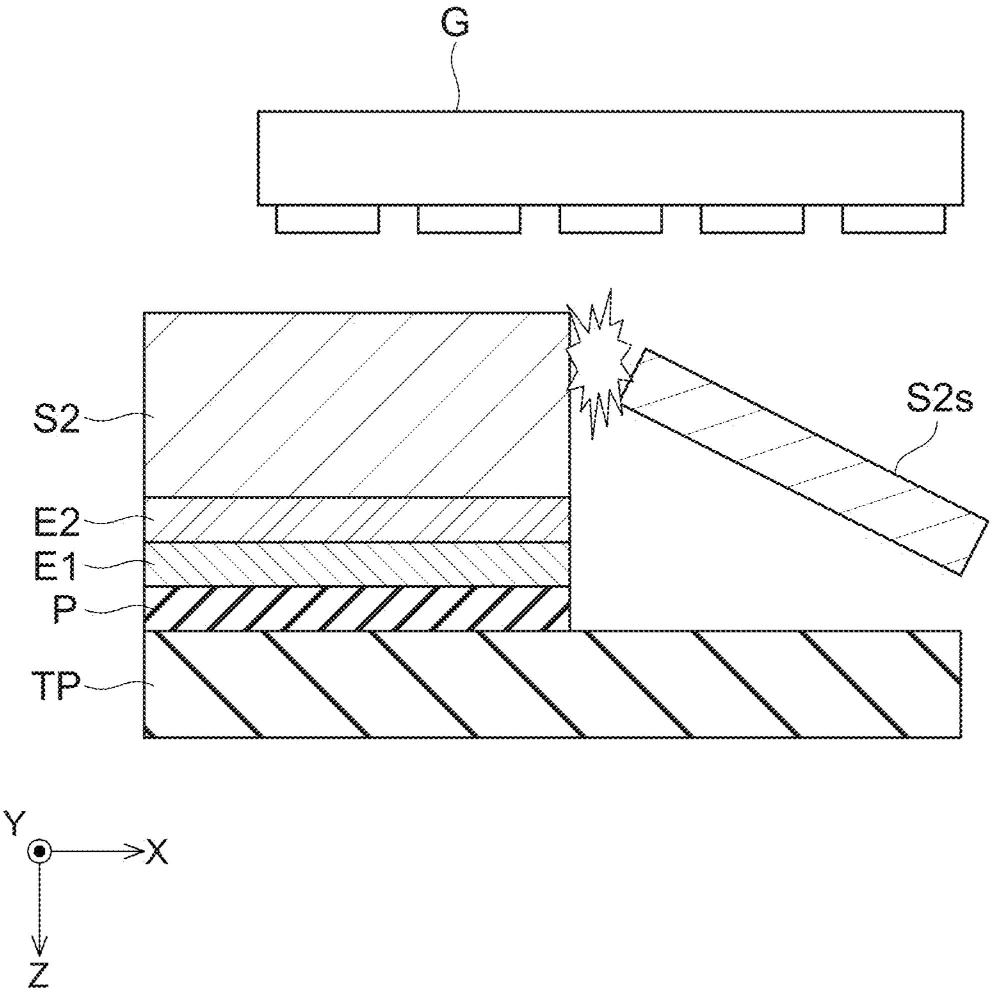
FIG. 7 is a cross sectional view showing an example of a manufacturing method of a semiconductor device according to a first comparative example.

FIG. 7 is a cross sectional view showing an example of a manufacturing method of a semiconductor device according to a first comparative example. The first comparative example differs from the first embodiment in that the cut mark T2 is not formed.

FIG. 7 shows the back surface grinding step shown in FIG. 2C. In the example shown in FIG. 7, the level difference portion S2*s* of the substrate S2 may become chipped during back surface grinding. In this case, there is a possibility that a chip may occur in an outer circumferential end section of the semiconductor wafer W to make it difficult to detect the notch N.

In contrast, in the first embodiment, the level difference portion S2*s* is separated and drops to the tape TP before the level difference portion S2*s* chips. Therefore, chipping in the outer circumferential end section of the semiconductor wafer W is suppressed. Accordingly, chipping near the notch N can be suppressed and the notch N can be detected with higher accuracy and in a shorter period of time.

Second Comparative Example

Figure 8:
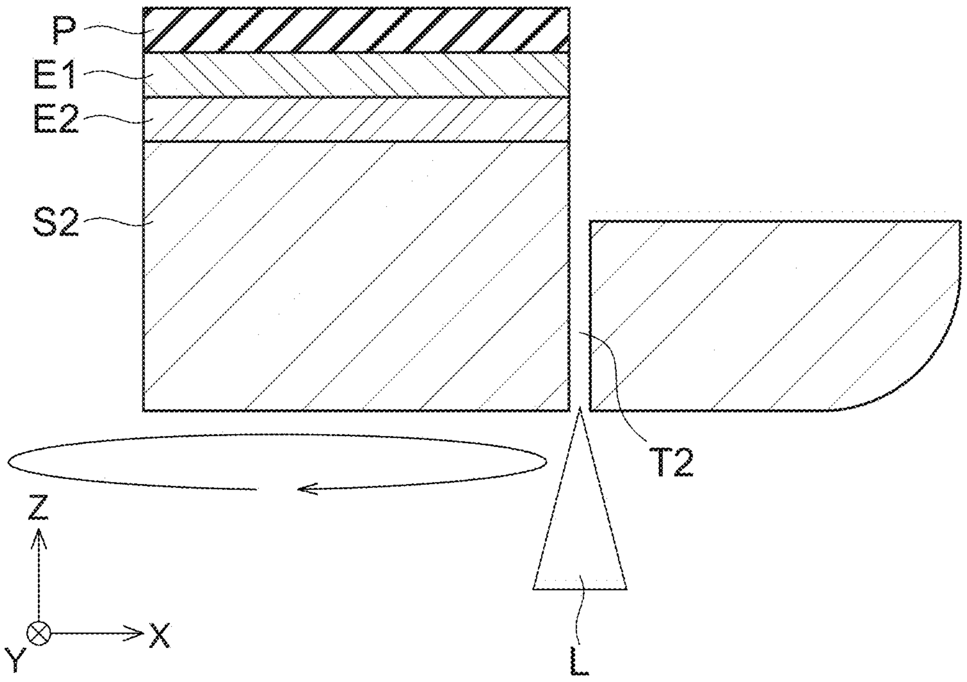
FIG. 8 is a cross sectional view showing an example of a manufacturing method of a semiconductor device according to a second comparative example.
Figure 9:
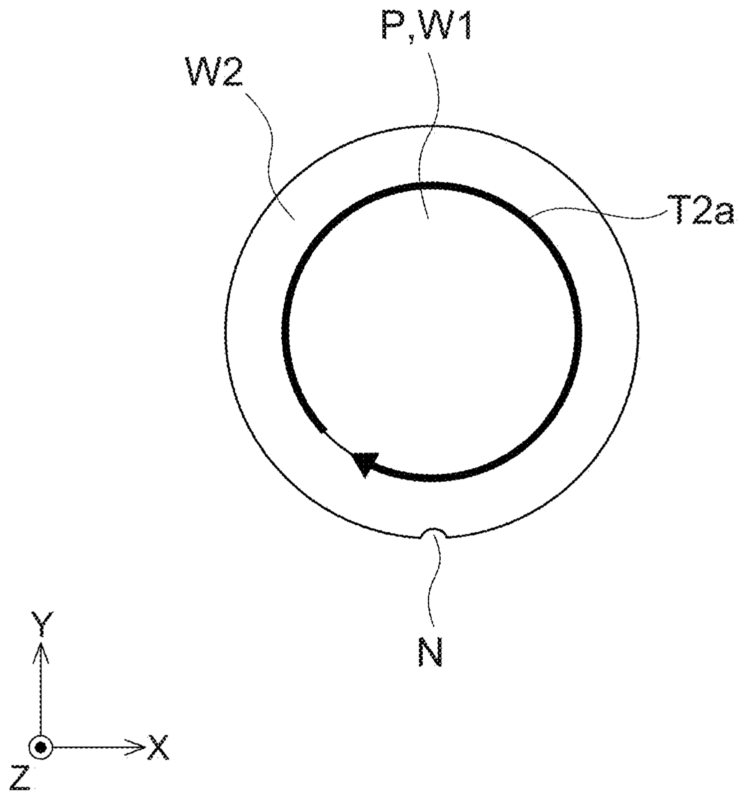
FIG. 9 is a top view showing an example of a placement and a shape of a cut mark according to the second comparative example.

FIG. 8 is a cross sectional view showing an example of a manufacturing method of a semiconductor device according to a second comparative example. FIG. 9 is a top view showing an example of a placement and a shape of a cut mark T2*a* according to the second comparative example. The second comparative example differs from the first embodiment in that the cut mark T2*a* is formed in an approximately circular shape as viewed from a face F2.

In the examples shown in FIG. 8 and FIG. 9, the cut mark T2*a* is formed in an approximately circular shape as viewed from a direction approximately perpendicular to the face F2. The cut mark T2*a* is formed using, for example, laser light L in stealth dicing. In this case, the level difference portion S2*s* separates from the semiconductor wafer W and drops in a ring shape at the start of back surface grinding or during back surface grinding. However, in the example shown in FIG. 9, since there is no end section T2*e* and the cut mark T2*a* is connected, the semiconductor wafer W is cut through. In this case, there is a possibility that the ring-shaped level difference portion S2*s* bonded to the tape TP may fall out due to an external impact or the like.

In contrast, in the first embodiment, the cut mark T2 does not provide a through-cut of the semiconductor wafer W. Since the semiconductor wafer W is partially cut (half-cut), the semiconductor wafer W can be made more resistant to external impact.

(First Modification)

Figure 10:
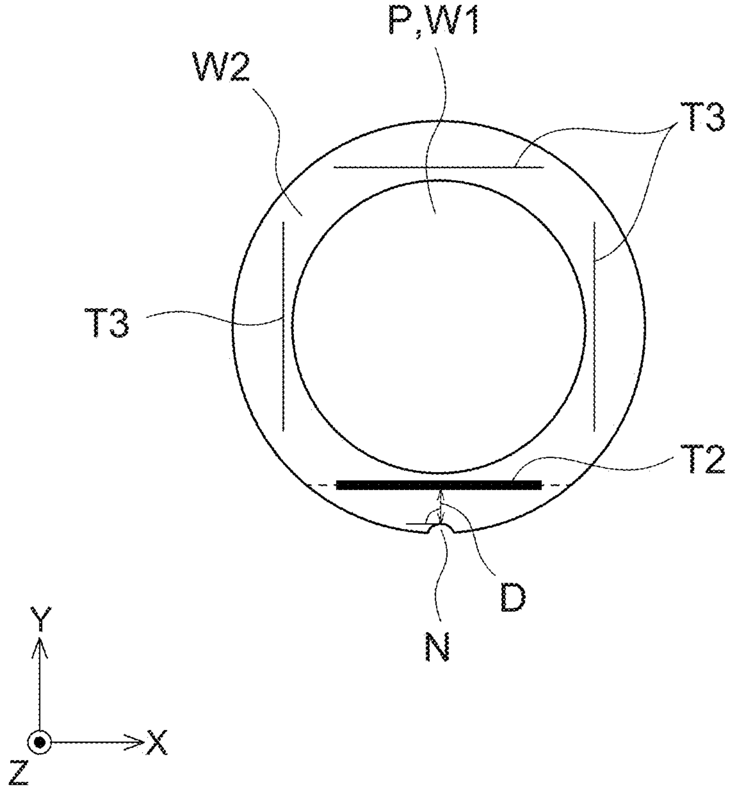
FIG. 10 is a top view showing an example of a placement and a shape of cut marks according to a first modification.

FIG. 10 is a top view showing an example of a placement and a shape of cut marks T2 and T3 according to a first modification. The first modification differs from the first embodiment in that a cut mark T3 is formed.

In the step shown in FIG. 2B, together with forming the cut mark T1 and the cut mark T2, one or more cut marks T3 may be formed. The cut mark T3 is formed at a position that is farther away from the notch N of the semiconductor wafer W2 than the cut mark T2. The cut mark T3 has a shape or dimensions that differ from the cut mark T2. In the example shown in FIG. 10, a width of the cut mark T3 is smaller than a width of the cut mark T2. In addition, the number of the cut marks T3 is not limited to the example shown in FIG. 10.

When an outer circumferential position where a chip is likely to occur is known in advance, the cut mark T3 is formed so that the level difference portion S2*s* where the chip is likely to occur becomes separated. Accordingly, chipping of the outer circumference of the semiconductor wafer W can be further suppressed. As a result, the notch N can be more readily detected.

The cut mark T3 may be formed as in the first modification. The position determining method according to the first modification is capable of producing a similar effect to the first embodiment.

(Second Modification)

Figure 11:
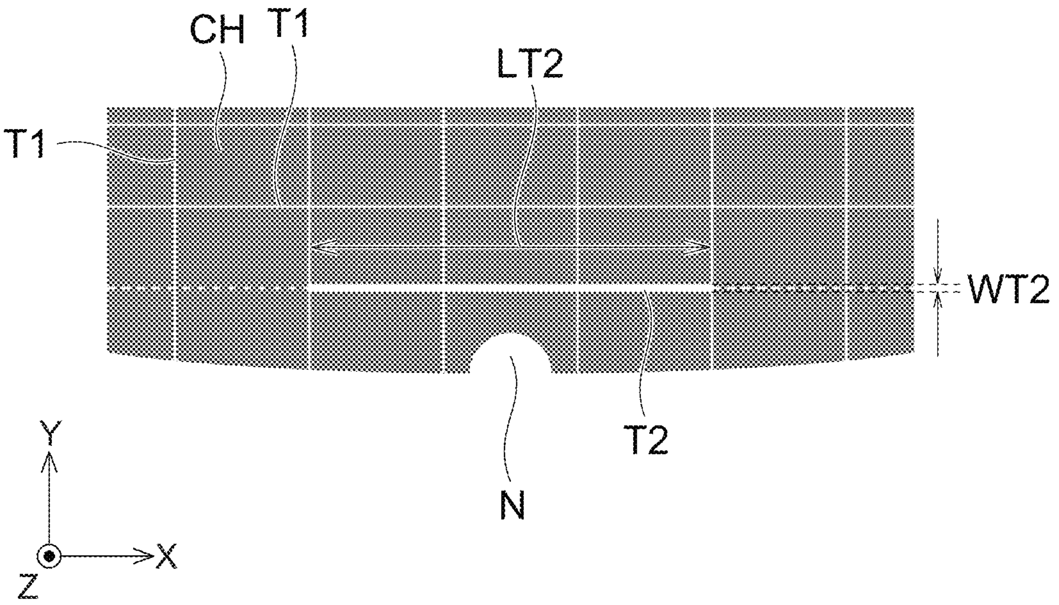
FIG. 11 is a diagram showing an example of a placement of cut marks and a notch according to a second modification.

FIG. 11 is a diagram showing an example of a placement of cut marks T1 and T2 and a notch N according to a second modification. The second modification differs from the first embodiment in that a length in the X direction of the cut mark T2 is further used to detect the cut mark T2.

In FIG. 11, the width is a width along the X direction. In FIG. 11, the length is a length along the Y direction.

The position determiner 130 determines a position of the semiconductor wafer W based on a width and a length of received light. Accordingly, the cut mark T2 can be detected with higher accuracy.

In FIG. 3A, a width of the level difference portion S2*s* is, for example, approximately 3.4 mm. A length LT2 of the cut mark T2 is, for example, approximately 25 mm. Laser-off accuracy (stopping accuracy) in stealth dicing is, for example, approximately 50 μm at a cut speed of 500 mm/s. Therefore, the cut mark T2 can be formed with a sufficiently small error relative to the length LT2 of the cut mark T2.

The length of the cut mark T2 may be further used to detect the cut mark T2 as in the second modification. The position determining method according to the second modification is capable of producing a similar effect to the first embodiment.

Second Embodiment

Figure 12:
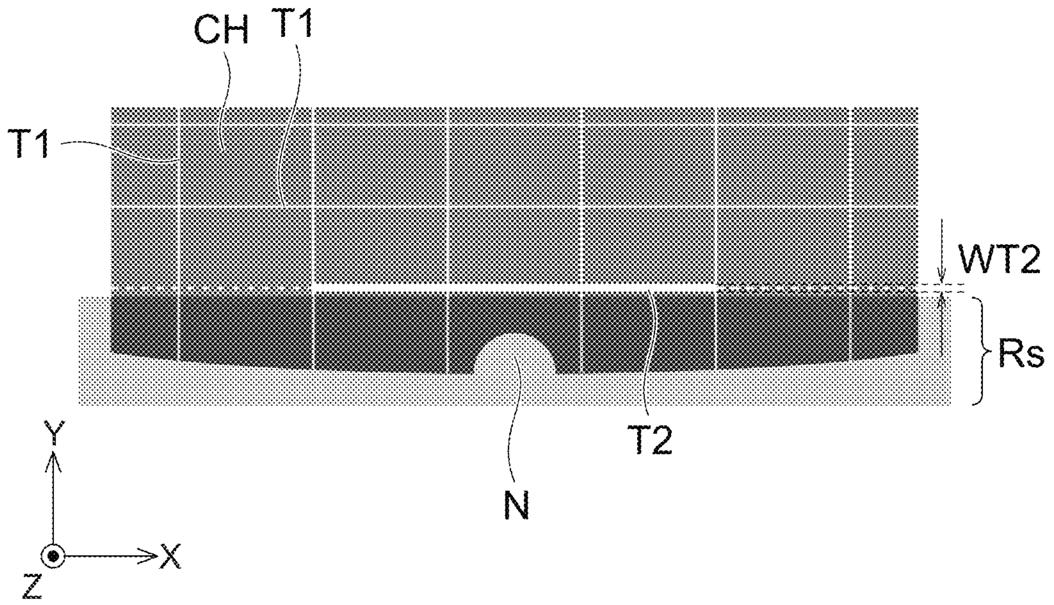
FIG. 12 is a diagram showing an example of a placement of cut marks and a notch according to a second embodiment.

FIG. 12 is a diagram showing an example of a placement of the cut marks T1 and T2 and the notch N according to a second embodiment. The second embodiment differs from the first embodiment in a detection method of the notch N.

The position determiner 130 calculates (determines), based on the cut mark T2, a search region Rs in which the notch N is to be searched. For example, the search region Rs is a region on an outer circumferential side of the semiconductor wafer W from a line drawn by extending the cut mark T2. Next, the position determiner 130 detects the notch N by searching for the notch N in the search region Rs. Accordingly, a search region can be narrowed down and the notch N can be detected with higher accuracy and in a shorter period of time.

The detection method of the notch N may be changed as in the second embodiment. The position determining method according to the second embodiment is capable of producing a similar effect to the first embodiment. In addition, the first modification and the second modification of the first embodiment may be combined with the position determining method according to the second embodiment.

Third Embodiment

Figure 13:
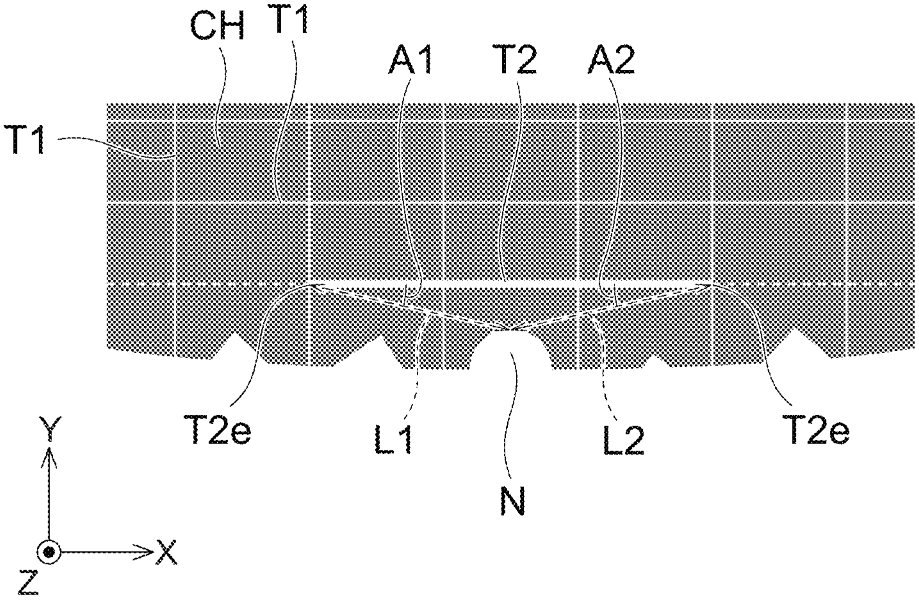
FIG. 13 is a diagram showing an example of a placement of cut marks and a notch according to a third embodiment.

FIG. 13 is a diagram showing an example of a placement of the cut marks T1 and T2 and the notch N according to a third embodiment. The third embodiment differs from the first embodiment in the detection method of the notch N.

The position determiner 130 calculates a candidate position of the notch N based on the cut mark T2 and a placement relationship between the cut mark T2 and the position of the notch N set in advance. Note that in the step shown in FIG. 2B, the cut mark T2 is provided at a position based on the placement relationship and the position of the notch. The placement relationship shown in FIG. 13 includes, for example, distances L1 and L2 between each of the two end sections T2*e* and the notch N. The placement relationship shown in FIG. 13 includes, for example, angles A1 and A2 between lines connecting each of the two end sections T2*e* and the notch N to each other and the cut mark T2. Next, the position determiner 130 detects the notch N by searching for the notch N based on the calculated candidate position of the notch N. Accordingly, a search region can be narrowed down and the notch N can be detected with higher accuracy and in a shorter period of time.

In addition, the larger the amount of feedback on information on the placement relationship or, in other words, information on a position where the cut mark T2 is to be formed, the larger the number of preliminary lines that can be drawn between the cut mark T2 and the notch N as shown in FIG. 13. As a result, detection accuracy of the notch N can be improved.

FIG. 13 also shows a chip in the outer circumferential end section of the semiconductor wafer W near the notch N as an example. Due to the presence of the chip near the notch N, detection accuracy of the notch N may decline. In the third embodiment, by calculating a candidate position of the notch N, the notch N can be more accurately detected even when a chip is present near the notch N.

The detection method of the notch N may be changed as in the third embodiment. The position determining method according to the third embodiment is capable of producing a similar effect to the first embodiment. In addition, the first modification and the second modification of the first embodiment and the second embodiment may be combined with the position determining method according to the third embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A position determining method of a wafer which has a plurality of singulated chips and which is pasted on a tape, the position determining method comprising:

irradiating, with light, the wafer which has a first cut mark provided between the chips and a second cut mark with a width that differs from a width of the first cut mark;

receiving irradiated light at a position opposing an irradiation position of the light across the wafer; and determining a position of the wafer based on a width of received light having passed through the wafer, wherein the determining the position of the wafer based on the width of the received light includes:

detecting the second cut mark based on the width of the received light;

detecting a notch based on the second cut mark; and determining a position of the wafer based on the notch.

2. The position determining method according to claim 1, wherein the detecting the notch based on the second cut mark includes:

calculating a search region in which the notch is to be searched for based on the second cut mark; and detecting the notch by searching for the notch in the search region.

3. The position determining method according to claim 1, wherein the detecting the notch based on the second cut mark includes:

calculating a candidate position of the notch based on the second cut mark and a placement relationship between the second cut mark and a position of the notch set in advance; and detecting the notch by searching for the notch based on the candidate position.

4. The position determining method according to claim 3, wherein the second cut mark is provided at a position based on the placement relationship and the position of the notch.

5. The position determining method according to claim 1, further comprising:

determining the position of the wafer based on the width of the received light and a length of the received light.

6. The position determining method according to claim 1, wherein the second cut mark is provided in an outer circumferential portion of the wafer, and wherein the position determining method further comprises irradiating the outer circumferential portion of the wafer with the light.

* * * * *